United States Patent [19]

Rich et al.

[11] 3,904,492

[45] Sept. 9, 1975

[54] DUAL RESIST USAGE IN CONSTRUCTION OF APERTURED MULTILAYER PRINTED CIRCUIT ARTICLES

[75] Inventors: David W. Rich, Poughkeepsie; Matthew C. Smith, Pleasant Valley; Michael Zipay, Stormville, all of N.Y.

[73] Assignee: International Business Machines Corporation, Armonk, N.Y.

[22] Filed: Feb. 22, 1972

[21] Appl. No.: 228,288

Related U.S. Application Data

[63] Continuation of Ser. No. 885,771, Dec. 17, 1969, abandoned.

[52] U.S. Cl. .................. 204/38 B; 29/625; 96/36.2; 96/36

[51] Int. Cl.[2] .............................................. C25D 5/00

[58] Field of Search ........ 96/36, 35.1, 36.2; 29/625; 204/38 B

[56] References Cited

UNITED STATES PATENTS

| | | | |
|---|---|---|---|
| 3,403,024 | 9/1968 | Luce | 96/36 |
| 3,469,982 | 9/1969 | Celeste | 96/35.1 |
| 3,476,561 | 11/1969 | Bertelsen et al. | 96/36 |

OTHER PUBLICATIONS

Eastman Kodak Co. – Chemical Milling With Kodak Photosensitive Resists, 1968, pp. 11 & 12 only.

E. I. Du Pont de Nemours & Co. – Riston Photopolymer Film Resist System, Public distribution, 6/10/69, pp. 6, 10, 11 & 12 only.

*Primary Examiner*—David Klein
*Attorney, Agent, or Firm*—Robert Lieber

[57] ABSTRACT

Novel dual resist masking techniques are introduced for protecting surfaces of a multilayer pre-perforated foil clad object during etching and plating processes. The primary mask attached directly to object surfaces is a thin high resolution film specifically adapted not to clog the perforations. It is developed from a liquid-type photo-resist which forms an irregular and imperfect cover at edges of surface incisions such as perforation rims and etched channels. The secondary mask adherent directly to the primary mask is formed from a thick layer of photopolymerizable solid film resist. Development is controlled to preserve the integrity of form and adherence of the underlying primary mask. The secondary mask serves principally to mask edges of surface incisions at perforation aperture rims and etched line channels. It is applied in sufficient thicknesses to completely span the apertures and fully cover etched incisions without shearing or cracking at sharp projecting edges.

1 Claim, 10 Drawing Figures

PATENTED SEP 9 1975 3,904,492

INVENTORS
DAVID W. RICH
MATTHEW C. SMITH
MICHAEL ZIPAY

BY Robert Lieber

ATTORNEY

DUAL RESIST USAGE IN CONSTRUCTION OF APERTURED MULTILAYER PRINTED CIRCUIT ARTICLES

This is a continuation of application Ser. No. 885,771, filed Dec. 17, 1969.

BACKGROUND OF THE INVENTION

1. Field of the Invention

This invention pertains to printed circuit manufacture and especially to novel techniques for constructing and utilizing multi-purpose composite photo-resist masks. These masks are especially useful in etching and plating objects containing sharply incised surface features.

2. Description of the Prior Art

In general it is well known to use identical dual applications of one photo-resist medium to construct etching or plating masks with inherent compensation for random defects or flaws in the individual masks. Such usage has been extensively treated in the patent literature. Customarily component masks of identical thickness are formed by successive applications, and identical image-wise exposures and developments, of identical photo-resist layers.

Our invention resides in the application and construction of novel dual resist composite masks featuring component mask layers having different thickness, composition, applicational solidity and, in certain instances, image patterning. These component masks are made from resist media which develop compatibly and yet provide distinctively different component masking functions. The primary mask component, which is usually applied in a thin liquid layer, has fine image copying properties and is thin enough to be easily removed from recesses. The secondary mask component, applied in a thick layer over the processed primary component, has lesser image resolving capability than the primary component but possesses sufficient applicational substances to cover incised and perforated surfaces, and to bridge over perforation recesses without shearing or cracking at rims or other stress points.

SUMMARY

We have invented a method for constructing photoresist masks upon objects having surfaces including incisions, perforations or other features of sharp edge delineation or articulation. The method is especially useful in processes incidental to printed circuit manufacture, such as etching and plating.

A feature of the invention is the construction of a composite dual layer photo-resist mask containing a thin primary intermediate layer and a thick secondary top layer.

Characteristically, the primary layer is formed by application, photo-exposure, development and hardening of a first photo-resist material. The application is usually thin and liquid in consistency.

The top layer is formed by application, photoexposure, development and hardening of a second photoresist material. This material is applied in a solid photopolymerizable film form directly over the formed and processed primary layer. The secondary application must have thickness sufficient to bridge surface recesses and cover edges without shearing or cracking at places of edge articulation or stress. It must also be subject to compatible photo-development over the primary mask so that the form and adhesional integrity of the primary mask is faithfully preserved.

In the embodiment of our etching application the object to be masked is a foil-clad laminate with unplated connecting perforations requiring masking protection against contact with the etching agent. The primary mask carries the etching pattern. The secondary mask provides cover for the apertures. The primary mask layer is sufficiently thin to avoid problems in regard to removal of resist material from the perforations.

In the plating application the object to be masked is a perforated laminate with incised surfaces forming a delicate finely detailed pattern of etched lines and lands. A plating deposit is required to be formed selectively only upon perforation surfaces and lands. Thus the etched line incisions must be compositely masked by photo-resist layers which provide complete integrity of form and adhesion, and can be dissolved out of the perforated areas without too much difficulty.

The composite mask of the invention is useful to provide the specialized masking functions required in both of the foregoing applications.

DETAILED DESCRIPTION OF PREFERRED EMBODIMENTS

Figure 1A:
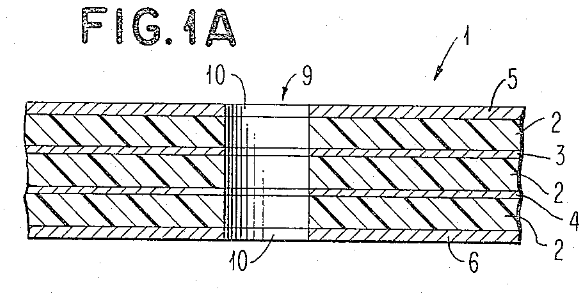
FIGS. 1A through 1J illustrate schematically the progressive formation, in accordance with the invention, of finely resolved printed circuit etching patterns and selectively plated lands and perforations in a multilayered laminate object containing perforations or otherwise pre-formed apertures.

Referring to FIGS. 1A through 1J multilayered foil-clad object 1 having internal insulating layers 2 and internal patterns 3, 4 of conductors is subjected to successive etching and plating operations. In the etching phase external foil layers 5, 6 are formed into finely resolved patterns of lines 7 and lands 8 shown in FIG. 1E.

Prior to etching the object is provided with apertures or perforations such as 9 through which plated through hole connections are scheduled to be formed. Rims 10 and internal wiring layers 3 and 4 exposed at these apertures must be protected during the etching process.

Figure 1B:
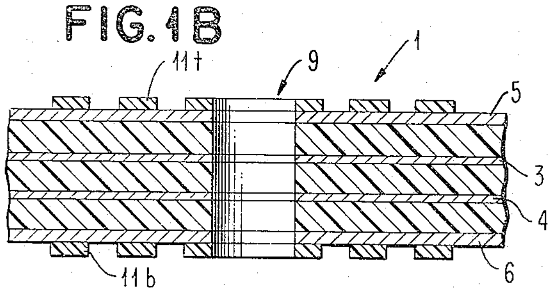

FIG. 1B shows object 1 now covered by thin top and bottom primary resist mask components, 11*t* and 11*b* respectively. These primary masks are developed from thin photo-resist coatings usually applied in liquid form. The coatings are photo-exposed image-wise and developed into the indicated patterns. The coatings are applied in sufficiently thin layers to provide fine image resolution and remove easily from surfaces of the perforations 9, so that these surfaces are not obstructed in subsequent plating procedures.

Figure 1C:
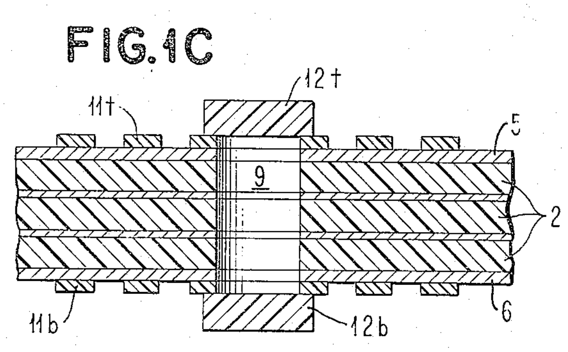
Figure 1D:
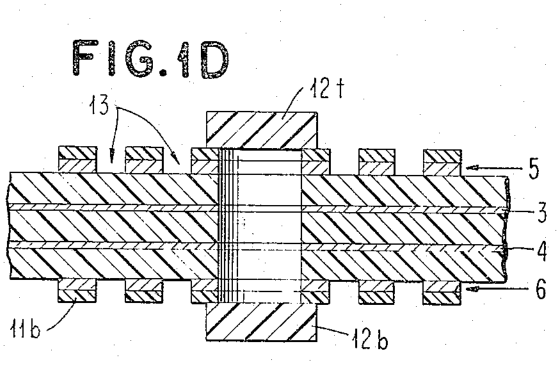
Figure 1E:
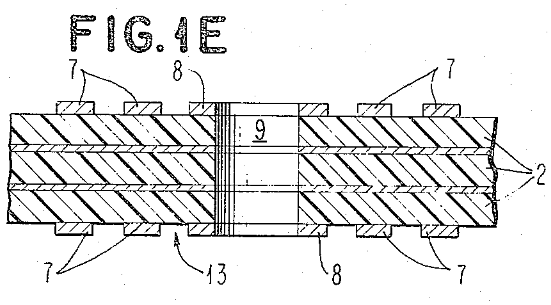
Figure 1F:
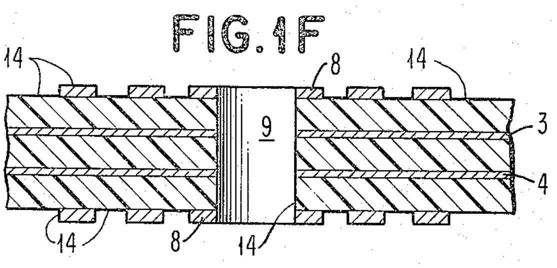
Figure 1G:
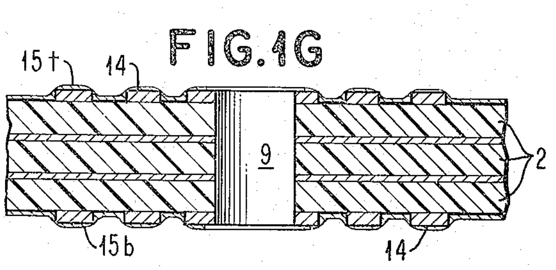

FIG. 1C shows the object covered with secondary masks 12*t* (on top) and 12*b* (on bottom) providing protective bridging cover for apertures 9 and portions of conductors 5 and 6 which become concentric lands 8 (FIG. 1E). These resist mask layers 12 are laid down in a solid photopolymerizable film form and exposed and developed in the required "land-only" patterns.

FIG. 1D shows etching of patterned incisions such as 13 in exposed parts of foil layers 5 and 6. FIG. 1E indicates the resulting patterned configuration after removal of the etch resist masks. FIGS. 1F through 1J, discussed later, indicate further processing of this configuration to build up conductive electro-plated deposts selectively only upon the lands 8 and interior sur- aces of the perforations 9 shown in FIG. 1E.

It is advantageous to etch objects of the indicated :onfiguration prior to the plating process in order that :tched lines may be formed to critical thickness and pacing tolerances. One readily appreciates that the ower limits of width and spacing of etched lines are af- ected by the initial thickness of the layer sought to be :tched.

However, etching before plating introduces masking roblems. Aperture surfaces must be masked so that nterior layers of circuitry 3, 4 and aperture rims are ıot attacked by the etchant. With improper or inade- quate masking the reliability, consistency and certainty f completion of plated through hole connections is re- luced.

It might appear that as an alternative one could delay ormation of apertures until after the etching process. This however is unsuitable because the exterior foil lay- :rs are no longer continuous after etching and are hereby subject to detachment in later drilling, or other operations by which the apertures are formed. There is he further disadvantage that rejects in a post-drilling operation are considerably more costly than pre-drilled ejects having undergone additional work in the etch- ng process and inspections incidental thereto.

Accordingly, the most practical alternative is to form ıpertures, etch surface lines and plate apertures, in that equence. In order to accomplish this however the pro- ective masking of apertures during the etching process ınd the masking of etched surfaces, to preserve line pacing and width tolerances in the aperture plating rocess, present problems which are addressed by the resent invention.

For etching the apertures must be masked by second- ıry photo-resist materials having sufficient applica- ional substance and thickness to bridge over aperture ecesses without shearing at rims. Solid photopolym- :rizable commercial film preparations useful for this urpose have inadequate resolution for creating the de- ired finely spaced line image of the etching pattern 13. Liquid type photo-resists possessing suitable copying esolution properties are incapable of reliably masking ıpertures such as 9 without clogging them and creating lifficult removal problems.

Accordingly, we have found that a mask formed by . composite 11, 12 of a thin liquid film application and . thick solid photopolymerizable film application is est suited to provide the required image definition and ıperture masking functions. The image of the pattern f incisions 13 to be etched is formed in the primary hin photo-resist coating and the less finely resolved im- ıges of aperture and land masks 12*t*, 12*b* are formed in he comparatively thick photopolymerizable solid film oating.

Since the solidly applied film coating is photo- xposed and developed upon an already developed and ıardened primary mask it is essential that the second- ıry mask development process be controlled to pre- erve the integrity of form and adhesion of the very thin ınd relatively vulnerable primary mask as well as to in- ure adequate adhesion of the secondary mask to the uter surfaces of the primary mask.

Compatible primary masks have been formed out of hotoresist coatings having either negative or positive hotosensitivity (i.e., insolubilize or solubilize when ex- osed). A negative type resist used successfully as a primary mask coating contains polyvinyl cinnamate polymer with added sensitizers and stabilizers and is sold by the Eastman Kodak Company under the tradename KPR. A positive type resist used successfully as a primary coating contains: two basic polymer ingredients — a cresol: formaldehyde resin and a polyvinyl methyl ether — mixed with a diazo ketone sensitizer in a solvent; for example the commercial preparation sold as AZ111 by Shipley Company Inc.

The primary resist coating is applied following conventional procedures of: surface cleansing and preparation, resist preparation, coating application (dip and whirl or spin, etc.), and pre-baking to remove resist solvents. After image-wise exposure the primary coating is developed as the primary mask by conventional development and rinsing procedures with an added post baking step to ensure adequate hardening.

The secondary mask is formed from a solid coating application of a resist laminate preparation containing a polymethyl methacrylate polymer and a sensitizer and/or cross-linking agent in an organic solvent mixture. The material sold as Riston by E. I. duPont deNemours and Company has been used in the present application with excellent results.

The film is applied over and adhered by lamination pressure to the surface of the developed, hardened and cleansed primary mask. The secondary mask development is controlled to ensure preservation of primary mask integrity without removal complications. Thus the usual steps of pre-baking and post-baking, by which solvents would be extracted and mask hardness increased, are omitted. A suitable secondary mask development procedure is outlined as follows:

a. Exposed secondary film is subjected to a sprayed developer solution of 1.1.1. trichloroethane inhibited, at a pressure of 8–16 psi and temperature not exceeding 60°F. The immersion period varies from 30 to 120 seconds according to secondary film thickness. Then, immediately after this the object is b. immersed in a tray of clean 1.1.1. trichloroethane-inhibited, for 5 to 10 seconds; and c. rinsed in warm water, 75°–85°F, for 15 to 20 seconds.

After the secondary mask 12*t*, 12*b* have been photo-developed and hardened as previously described the masked object is etched by immersion in a suitable etching medium. The preferred etching system is outlined as follows:

Ferric chloride 30′ Baume, 120°F used in any of the conventional etching assemblies available commercially.

The fully etched pattern with composite photo-resist etching masks 11, 12 removed is shown in FIG. 1E. Lines 7 in this pattern typically have lower bound widths of 0.003 inches controlled to tolerances of plus or minus 0.0005 inches. Spaces between adjacent lines are of similar minimal size held to similar tolerances.

The composite resist mask is removed by immersing the etched multilayer object in any of the commercial solvent preparations containing dichloro-methane which are used ordinarily to remove solid photopolymerized resists.

The etched object must now be electro-plated as shown in FIGS. 1F through 1J to form aperture through-connections. It is desirable to overlap and anchor these platings to the concentric land areas 8 surrounding the apertures 9 so that more secure and reliable through connections are established.

The preferred plating procedure includes successive immersions of the etched object in suitable electroless and electrolytic plating media whereby the entire object surface is first covered with a very thin flash layer 14 of electroless copper forming a common electrode for the electroplating operation to follow. Details of the process of construction of this flash copper deposit are outlined as follows:

Etched multilayer surfaces and apertures are made receptive to electroless copper deposition by immersing in successive cleaning solutions and sensitizers, i.e., paladium chloride - stannous chloride. Electroless copper is then deposited over the entire surface of the multilayer followed by a flash electrolytic deposition of copper to a thickness of 0.0001 inches.

We now proceed to construct (FIGS. 1G, 1H) composite photo-resist masks 15, 16 for the electroplating operation. These masks are similar in construction to the composite mask utilized in the etching process but differ in several material respects outlined next.

The function of the primary underlying mask 15t, 15b (FIG. 1G) is to fill in the channel spaces 13 between lines of the etched and flash plated object. This forms a more level and substantial surface to which the thicker and more substantial secondary film can be more reliably and sealably adhered without stressing the relatively fragile etched lines 7. The thin primary films are formed as before from photoresist material applied in liquid form, and this time developed only out of the perforated areas 9 and portions of the concentric land areas 8.

The secondary masks 16 are applied as solid photopolymerizable thick films, directly over the surface presented by the primary masks, and exposed and developed as before.

The preferred development process for the secondary films 16*t*, 16*b* is identical to the development process previously described in connection with the construction of the composite etching mask. The secondary and primary mask patterns in this case are identical. One observes that the primary masks in this instance serve to fill the etched incisions 13 and thereby provide more substantial substrates for adhesion of the secondary masks over the now delicately etched object as a seal-insuring expedient.

Figure 1H:
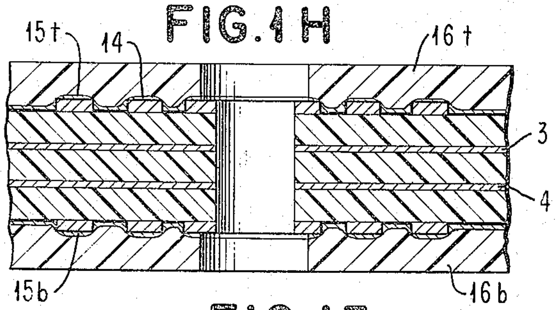
Figure 1I:
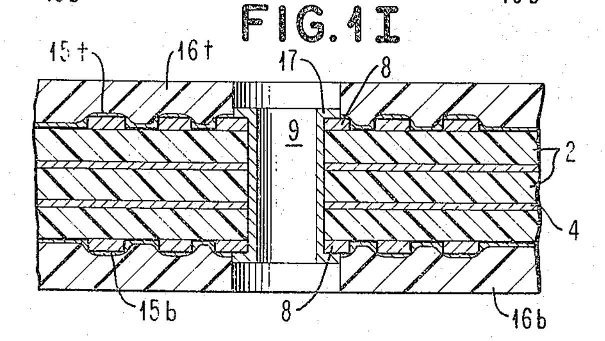

With the composite mask completed as shown in FIG. 1H the intermediately formed object is electroplated. This forms desired aperture connection platings 17 (FIG. 1I) which are ruggedly anchored to the overlapped lands 8 on the etched pattern. Electrode contact for this operation is made through flash deposited conductive layer 14.

Next plating composite resist masks are removed by a) solution and stripping of the secondary mask 16; b) dissolution of the primary mask 15; and c) removal by a quick etch of exposed parts of the flash electroless deposit layer 14. Details of these removal procedures are as follows:

Resist layers are dissolved as previously described utilizing appropriate commercially available solvents.

The copper flash common is removed by immersing the multilayer structure in an etching solution i.e., ammonium persulfate for a short period of time sufficient to dissolve the exposed parts of the common flash.

Figure 1J:
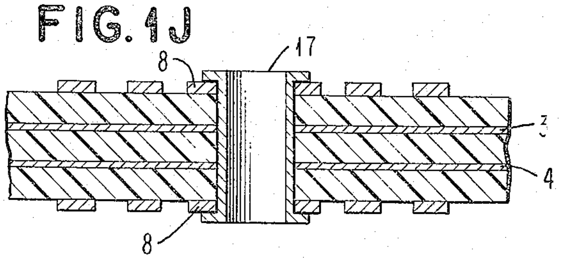

The object appears now in the final form shown in FIG. 1J, with finely detailed etched patterns in the exterior surfaces and with conductive platings upon apertures and lands.

We have shown and described above the fundamental novel features of the invention as applied to several preferred embodiments. It will be understood that various omissions, substitutions and changes in form and detail of the invention as described herein may be made by those skilled in the art without departing from the true spirit and scope of the invention. It is the intention therefore to be limited only by the scope of the following claims.

What is claimed is:

1. In a process for depositing metal selectively upon a multilayer object having interlayer connecting perforations and a finely resolved metallization pattern of incised lines and lands on exterior surfaces the steps of:

providing temporary electrical circuit paths for connecting electrolytic plating voltages to the said metallized lands;

constructing a composite mask, secured to said object and outlining the perforations and lands for plating while sealably masking the said lines, by the following sequence of steps:

a. coating said object surface with a thin uniform layer of a first photo-resist material having liquid form;

b. image-wise photo-exposing, developing and hardening said first material into a soluble primary mask component;

c. applying to the surface of said primary mask a thick film layer of a solid unexposed photopolymerizable second resist material which forms a continuous bridging cover over the incised aspect of said object surface;

d. image-wise photo-exposing and developing but not hardening said second photo-resist layer into a soluble secondary mask component;

e. said step d) of developing the photo-exposed second layer comprising in immediate sequence:

e1. spraying the masked object with a solution of 1.1.1. trichloroethane - inhibited, at a pressure of 8–16 psi and temperature not exceeding 60° F, for a period of between 30 and 120 seconds;

e2. contacting the object by immersion with a bath of 1.1.1. trichloroethane for a period of 5 to 10 seconds;

e3. rinsing the object in warm water at 75° to 85° F for a period of 15 to 20 seconds;

contacting said masked object with electroless and electrolytic metal plating media;

while the object is in contact with said electrolytic plating medium connecting plating potential to the said lands via said temporary path; and removing said mask and temporary circuit paths.

* * * * *